(12) United States Patent
James et al.

(10) Patent No.: US 7,758,759 B2
(45) Date of Patent: *Jul. 20, 2010

(54) INK JET PRINTING PROCESS FOR ETCHING METAL AND ALLOY SURFACES

(75) Inventors: Mark Robert James, Manchester (GB); David Cottrell, Upton-by-Chester (GB)

(73) Assignee: Fujifilm Imaging Colorants Limited, Manchester (GB)

( * ) Notice: Subject to any disclaimer, the term of this patent is extended or adjusted under 35 U.S.C. 154(b) by 760 days.

This patent is subject to a terminal disclaimer.

(21) Appl. No.: 10/576,936

(22) PCT Filed: Oct. 1, 2004
(Under 37 CFR 1.47)

(86) PCT No.: PCT/GB2004/004186

§ 371 (c)(1),
(2), (4) Date: Jan. 19, 2007

(87) PCT Pub. No.: WO2005/045098

PCT Pub. Date: May 19, 2005

(65) Prior Publication Data

US 2008/0245768 A1    Oct. 9, 2008

(30) Foreign Application Priority Data

Oct. 25, 2003    (GB) .............................. 0324947.1

(51) Int. Cl.
*B44C 1/22* (2006.01)
(52) U.S. Cl. .............................. 216/42; 216/13; 216/49; 216/83; 216/100; 216/105; 428/209; 428/469; 428/472; 430/270.1; 430/314; 430/329; 430/318

(58) Field of Classification Search .................. 216/13, 216/42; 428/209; 430/270.1
See application file for complete search history.

(56) References Cited

U.S. PATENT DOCUMENTS

| 4,536,468 | A |   | 8/1985 | Yasui et al. |
| 4,767,489 | A |   | 8/1988 | Lindner |
| 4,933,209 | A | * | 6/1990 | Anthony et al. .............. 427/116 |
| 6,444,140 | B2 | * | 9/2002 | Schemenaur et al. ......... 216/100 |
| 7,314,573 | B2 | * | 1/2008 | Hopper et al. ................. 216/13 |

FOREIGN PATENT DOCUMENTS

| EP | 0659038 A2 | 6/1995 |
| WO | WO 95/23244 | 8/1995 |

* cited by examiner

*Primary Examiner*—Duy-Vu Nguyen Deo
*Assistant Examiner*—Maki Angadi
(74) *Attorney, Agent, or Firm*—Morgan Lewis & Bockius LLP

(57) ABSTRACT

A process for etching a metal or alloy surface which comprises applying an etch-resist ink by ink jet printing to selected areas of the metal or alloy, solidifying the etch-resist ink without the use of actinic light and/or particle beam radiation and then removing the exposed metal or alloy by a chemical etching process wherein the etch-resist ink comprises the components:

A) 60 to 100 parts carrier vehicle comprising one or more components which contain at least one metal chelating group;
D) 0 to 40 parts colorant; and
E) 0 to 5 parts surfactant;

wherein the ink has a viscosity of not greater than 30 cPs (mPa·s) at the firing temperature, all parts are by weight and the total number of parts A)+B)+C)=100.

20 Claims, No Drawings

INK JET PRINTING PROCESS FOR ETCHING METAL AND ALLOY SURFACES

CROSS-REFERENCE TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATED-BY-REFERENCE OF MATERIAL SUBMITTED ON A COMPACT DISC

Not applicable.

BACKGROUND OF THE INVENTION (1) Field of the Invention

The present invention relates to a process for etching metal and alloy surfaces and to the products of such process.

(2) Description of Related Art

Photochemical machining (PCM) and mechanical etching (e.g. drilling, stamping, cutting and related processes) are known processes for etching metal and alloy surfaces. Etching may be restricted to the surface as is often the case for artistic articles and jewelry or it may involve total penetration as is often the case for industrial articles. The metal/alloy may be in the form of a sheet, foil or an article and when in the form of a thin sheet or foil, the metal/alloy may be physically supported by a non-etchable substrate which may be optionally removed in the final etched product.

Traditional PCM is a complex process involving the prior preparation of a photo-tool. Firstly, a metal or alloy surface is coated with a polymerisable etch-resist layer. A photo-tool is prepared which is a negative of the required etch image and is often a silver photographic emulsion plate. The photo-tool is placed directly over the etch-resist layer and is then exposed to UV light. This causes the etch-resist layer to polymerize and harden in those areas exposed to the UV light to produce a latent negative image of the required etch in the etch-resist layer. The etch-resist layer is then chemically treated to remove the unexposed and unpolymerised area of the etch-resist. This is known as the development step. This chemical treatment is typically mildly alkaline when the etch-resist layer contains free acid groups.

The exposed areas of metal or alloy which are not protected by the polymerised etch-resist layer are then selectively removed by chemical etching from those areas protected by the etch-resist layer. Finally, the polymerised etch-resist layer is optionally removed. This is typically achieved by treatment with alkaline media using, for example, aqueous alkali.

Although PCM is widely used in the manufacture of etched metals and alloys it is tedious, expensive and wasteful of materials because the etch-resist layer is made separately and applied over the total area of the metal or alloy substrate. Furthermore, the photo-tool containing the negative image of the desired etch pattern is often distanced from the etch-resist layer and diffraction of the UV light irradiation can lead to development and polymerisation in unwanted areas of the etch-resist directly beneath the photo-tool masked areas. This needs to be taken into consideration when preparing the photo-tool and can reduce the density and definition of etched features of finer detail.

EP 746 638 discloses the use of solvent-based and hot melt ink jet inks to manufacture textured rollers. However, EP 746 638 does not disclose the composition of such inks.

BRIEF SUMMARY OF THE INVENTION

In our research we have found that the chemical composition of the etch-resist ink is important because the ink must adhere to the metal or alloy surface during the etching step and should be made readily removable after etching if so desired. During etching fine details of the etch-resist pattern can be seriously compromised if either the unexposed etch-resist is incompletely removed or if some of the exposed and polymerised etch-resist is removed prior to chemically etching the metal or alloy. The requirements for adhesion and removability pose a difficult balance in etch-resist ink chemistry.

According to a first aspect of the present invention there is provided a process for etching a metal or alloy surface which comprises applying an etch-resist ink by ink jet printing to selected areas of the metal or alloy, solidifying the etch-resist ink without the use of actinic light and/or particle beam radiation and then removing the exposed metal or alloy by a chemical etching process wherein the etch-resist ink comprises the components:

A) 60 to 100 parts carrier vehicle comprising one or more components which contain at least one metal chelating group;

B) 0 to 40 parts colorant; and

C) 0 to 5 parts surfactant;

wherein the ink has a viscosity of not greater than 30 cPs (mPa·s) at the firing temperature, all parts are by weight and the total number of parts A)+B)+C)=100. The metal or alloy may be supported by a non-etchable substrate. If present the non-etchable substrate is preferably removed after etching.

DETAILED DESCRIPTION OF THE INVENTION

The Carrier Vehicle

The carrier vehicle provides fluidity to the etch-resist ink during firing and application to the metal or alloy surface. The carrier need not be liquid at 25° C. but must be liquid at the temperature at which the ink is fired from a printhead of the ink jet printer (i.e. the firing temperature). The firing temperature is typically from 10° C. to 200° C., but is more preferably from 10° C. to 150° C.

The carrier vehicle preferably also facilitates solidification of the etch-resist ink as a whole. Preferred types of etch-resist inks are hot melt, thermally curable and volatile etch-resist-inks. In the case of a hot melt etch-resist ink the carrier vehicle preferably comprises a wax or polyamide polymer or mixture thereof which solidifies on cooling. In the case of a thermally curable etch-resist ink the carrier vehicle preferably comprises one or more thermally reactive monomers, prepolymers or mixtures thereof which solidify on heating above the firing temperature. In the case of a volatile etch-resist ink the carrier vehicle preferably comprises a volatile liquid and a resin wherein the volatile liquid is evaporated from the etch-resist ink, typically by heating, leaving a solidified resin optionally with a colorant and surfactant.

Because of trends in legislation regarding volatile organic liquids and the desirability of minimising odour during the printing process it is sometimes preferred that the etch-resist ink is essentially free from volatile organic liquid.

By essentially free it is meant that only trace or residual levels of volatile organic liquids are lost through evaporation. Preferably not more than 1% and more preferably not more than 0.1% by weight of volatile organic liquid relative to the total amount of etch-resist ink is evaporated from the metal or alloy surface after printing. Such volatile organic liquids are herein defined as those having a boiling point below 200° C. Typical examples include low molecular weight alcohols, ketones, esters, ethers and amides.

The hot melt and thermally curable embodiments of the present invention are preferred over the volatile etch-resist ink embodiment.

Volatile Etch-Resist Inks

In the case of volatile etch-resist inks the carrier vehicle preferably comprises a volatile liquid (which is liquid at 25° C. and has a boiling point of less than 200° C.) and a resin. After the volatile etch-resist ink is printed the volatile liquid is evaporated from the metal or alloy surface leaving behind the etch-resist ink. The volatile liquid can be evaporated by heat and/or reduced pressure but it is preferable that the volatile liquid has a boiling point of less than 175° C., more preferably less than 150° C. and especially less than 110° C. at 1 atmosphere of pressure.

The volatile liquid may be a polar liquid or a non-polar liquid or a mixture thereof. By the term "polar" in relation to the volatile liquid it is meant that a volatile liquid is capable of forming moderate to strong bonds as described in the article entitled "A Three Dimensional Approach to Solubility" by Crowley et al in Journal of Paint Technology, Vol. 38, 1966, at page 269. Such liquids generally have a hydrogen bonding number of 5 or more as defined in the abovementioned article.

Examples of suitable polar volatile liquid are amines, ethers, especially lower alkyl ethers, organic acids, esters, ketones, glycols, alcohols, amides, ureas, sulphoxides, sulphones and water. Numerous specific examples of such moderately strongly hydrogen bonding liquids are given in the book entitled "Compatibility and Solubility" by Ibert Mellan (published in 1968 by Noyes Development Corporation) in Table 2.14 on pages 39-40 and these liquids all fall within the scope of the term polar volatile liquid as used herein.

Preferred polar volatile liquids are dialkyl ketones, alkyl esters of alkane carboxylic acids and alkanols, especially such liquids containing up to, and including, a total of 6 carbon atoms. As examples of the preferred and especially preferred pole liquids there may be mentioned dialkyl and cycloalkyl ketones, such as acetone, methyl ethyl ketone, diethyl ketone, di-isopropyl ketone, methyl isobutyl ketone, di-isobutyl ketone, methyl isoamyl ketone, methyl n-amyl ketone and cyclohexanone; alkyl esters such as methyl acetate, ethyl acetate, isopropyl acetate, butyl acetate, ethyl formate, methyl propionate, methoxy propylacetate and ethyl butyrate; glycols and glycol esters and ethers, such as ethylene glycol, 2-ethoxyethanol, 3-methoxypropylpropanol, 3-ethoxypropylpropanol, 2-butoxyethyl acetate, 3-methoxypropyl acetate, 3-ethoxypropyl acetate and 2-ethoxyethyl acetate; alkanols such as methanol, ethanol, n-propanol, isopropanol, n-butanol and isobutanol and dialkyl and cyclic ethers such as diethyl ether and tetrahydrofuran. Especially preferred polar volatile liquids are alkanols, alkane carboxylic acids and esters of alkane carboxylic acids.

Preferred non-polar volatile liquids are non-halogenated aromatic hydrocarbons (e.g. toluene and xylene), halogenated aromatic hydrocarbons (e.g. chlorobenzene, dichlorobenzene, chlorotoluene), non-halogenated aliphatic hydrocarbons (e.g. linear and branched aliphatic hydrocarbons containing six or more carbon atoms both fully and partially saturated), halogenated aliphatic hydrocarbons (e.g. dichloromethane, carbon tetrachloride, chloroform, trichloroethane) and natural non-polar organics (e.g. vegetable oil, sunflower oil, linseed oil, terpenes and glycerides).

In one embodiment the volatile liquid is or comprises water.

When the volatile liquid comprises water it may be present in combination with a water-immiscible organic solvent but more preferably it is present with a water-miscible organic solvent.

Suitable water-immiscible organic solvents include aromatic hydrocarbons, e.g. toluene, xylene, naphthalene, tetrahydronaphthalene and methyl naphthalene; chlorinated aromatic hydrocarbons, e.g. chlorobenzene, fluorobenzene, chloronaphthalene and bromonaphthalene; esters, e.g. butyl acetate, ethyl acetate, methyl benzoate, ethyl benzoate, benzyl benzoate, butyl benzoate, phenylethyl acetate, butyl lactate, benzyl lactate, diethyleneglycol dipropionate, dimethyl phthalate, diethyl phthalate, dibutyl phthalate, di(2-ethylhexyl) phthalate; alcohols having six or more carbon atoms, e.g. hexanol, octanol, benzyl alcohol, phenyl ethanol, phenoxy ethanol, phenoxy propanol and phenoxy butanol; ethers having at least 5 carbon atoms, preferably $C_{5-14}$ ethers, e.g. anisole and phenetol; nitrocellulose, cellulose ether, cellulose acetate; low odour petroleum distillates; turpentine; white spirits; naphtha; isopropylbiphenyl; terpene; vegetable oil; mineral oil; essential oil; and natural oil; and mixtures of any two or more thereof. Benzyl alcohol is especially preferred.

Preferred water-miscible organic solvents include $C_{1-6}$-alkanols, preferably methanol, ethanol, n-propanol, isopropanol, n-butanol, sec-butanol, tert-butanol, n-pentanol, cyclopentanol and cyclohexanol; linear amides, preferably dimethylformamide or dimethylacetamide; ketones and ketone-alcohols, preferably acetone, methyl ether ketone, cyclohexanone and diacetone alcohol; water-miscible ethers, preferably tetrahydrofuran and dioxane; diols, preferably diols having from 2 to 12 carbon atoms, for example pentane-1,5-diol, ethylene glycol, propylene glycol, butylene glycol, pentylene glycol, hexylene glycol and thiodiglycol and oligo- and poly-alkyleneglycols, preferably diethylene glycol, triethylene glycol, polyethylene glycol and polypropylene glycol; triols, preferably glycerol and 1,2,6-hexanetriol; mono-$C_{1-4}$-alkyl ethers of diols, preferably mono-$C_{1-4}$-alkyl ethers of diols having 2 to 12 carbon atoms, especially 2-methoxyethanol, 2-(2-methoxyethoxy)ethanol, 2-(2-ethoxyethoxy)-ethanol, 2-[2-(2-methoxyethoxy)ethoxy]ethanol, 2-[2-(2-ethoxyethoxy)-ethoxy]-ethanol and ethyleneglycol monoallylether; cyclic amides, preferably 2-pyrrolidone, N-methyl-2-pyrrolidone, N-ethyl-2-pyrrolidone, caprolactam and 1,3-dimethylimidazolidone; cyclic esters, preferably caprolactone; sulphoxides, preferably dimethyl sulphoxide and sulpholane. Preferably the carrier vehicle comprises water and 2 or more, especially from 2 to 8, water-miscible organic solvents.

Especially preferred water-miscible organic solvents are cyclic amides especially 2-pyrrolidone, N-methyl-pyrrolidone and N-ethyl-pyrrolidone; diols, especially 1,5-pentane diol, ethyleneglycol, thiodiglycol, diethyleneglycol and triethyleneglycol; and mono-$C_{1-4}$-alkyl and $C_{1-4}$-alkyl ethers of diols, more preferably mono-$C_{1-4}$-alkyl ethers of diols having 2 to 12 carbon atoms, especially 2-methoxy-2-ethoxy-2-ethoxyethanol.

When the carrier vehicle comprises water it preferably comprises water and water-miscible organic solvent in a weight ratio from 99:1 to 50:50, more preferably from 95:5 to 60:40.

In an alternative embodiment the volatile liquid is free from water.

Volatile liquids which are free from water can be advantageous in a number of ways. Importantly we have found that the use of volatile liquids which are free from water allows more hydrophobic resins to be utilised because water solubilising or dissipating groups are not needed. We have noted improved etch-resist performance in aqueous etching environments for such embodiments. This is particularly so where the etching temperature is higher than 60° C. and/or when the pH of the etching liquid is outside the range pH 6 to 8.

The volatile liquid free from water preferably comprises any of the above volatile liquids other than water. Especially preferred volatile organic liquids are the water-miscible organic solvents as described above.

The aforementioned resin may be a natural or synthetic resin. Preferred natural resins include saccharides (especially starch, xanthan, guar) and proteins (especially casein and whey).

Preferred synthetic resins include polyethylenics (especially polyvinyl polymers), polyethers, polyamides, polyesters and polycarbonates. Preferred polyvinyl polymers include poly(meth)acrylates, poly styrenics, polyethylene and polypropylene.

The resin may be a homopolymer, a copolymer or a blend of two or more resins.

The number average molecular weight of the resin is preferably at least 5,000 and especially from 5,000 to 5,000,000.

The resin may be present in the carrier vehicle in the form of a solution or more preferably a dispersion. The resin can be present as a mixture of both a solution and a dispersion.

When the resin is in the form of a dispersion its number average molecular weight is preferably from 50,000 to 5,000,000 and more preferably from 80,000 to 1,000,000.

Preferably the resin is insoluble in alkaline water.

Preferably the resin has a calculated log partitioning co-efficient (Log P) value of at least 2 and more especially from 2 to 6. The calculated Log P of a resin may be calculated using commercially available computer software, for example using the Log P DB software version 7.04 or a later version of such software (which is available from Advanced Chemistry Development Inc (ACD labs)). Any ionic or ionizable groups are calculated in their neutral (unionized) form. Such hydrophobic resins have been found to significantly improve etch-resistance.

In the case of etch-resist inks wherein the volatile liquid is or comprises water and the resin has the above mentioned Log P values it is preferred that the resin is present in the form of a dispersion.

For a resin which is present in the carrier vehicle as a dispersion (rather than a solution) the volume average particle size is preferably less than 1 micron, more preferably less than 0.5 of a micron in order to inhibit the blocking of the ink jet printer nozzle. Preferably the particle size of the resin is measured by photon correlation spectroscopy (PCS).

Preferably the resin is capable of forming a continuous film on evaporation of the volatile liquid. This may require heating from 50 to 150° C. but it is preferred that the resin is capable of forming a film at approximately 25° C.

More than 20% by weight of resin in the carrier vehicle tends to give rise to higher viscosities and ink jet firing problems. Thus preferred volatile etch-resist inks have a carrier vehicle which comprises from 1 to 20 percent, more preferably from 3 to 15 percent and especially from 3 to 10 percent by weight of resin relative to the total weight of carrier vehicle.

A preferred firing temperature for volatile etch-resist inks is from 10 to 80° C., more preferably a temperature from 10 to 35° C. and especially from 20 to 25° C.

Hot Melt Etch-Resist Inks

In the case of hot melt etch-resist inks the carrier vehicle preferably comprises a material which is solid at 25° C. but which is liquid and can be ink jet fired at a suitable firing temperature. The firing temperature is typically in the range 50 to 200° C., but is preferably from 50 to 150° C. and especially from 70 to 120° C. Preferred hot melt ink carriers melt at a temperature from 40 to 120° C. For such inks the viscosity is preferably not greater than 30 cPs at 120° C. Hot melt inks and compositions are described in U.S. Pat. No. 6,336,720. Preferably the carrier vehicle comprises a wax or polyamide polymer or a mixture thereof.

Suitable waxes include petroleum wax, synthetic wax, plant wax, animal wax, ketone wax, polyester wax, higher alcohol wax, higher acid wax and the like.

Preferably the synthetic wax is a polyethylene wax or Fisher-Tropsch wax.

A preferred petroleum wax is paraffin wax.

The plant wax is preferably a carnuba or candelillia wax.

The animal wax is preferably beeswax or lanolin wax.

Other suitable types of wax are maleic anhydride and bisamide modified wax.

Other polymers which may be present in the carrier vehicle include terpene, urethane, acrylic, polyester, ethylene vinyl acetate and epoxy polymers.

Suitable Polyamide polymers include Tohmides™ (manufactured by Fujikasei), Polymides™ (manufactured by Sannyoukasie) and Versamid™ (manufactured by Henkel).

Preferably the hot melt ink has a sharp transition between solid and liquid phase as the temperature is raised and hence crystalline or semi-crystalline carrier vehicles are preferable.

Thermally Curable Etch-Resist Inks

In the case of thermally curable etch-resist inks the carrier vehicle preferably comprises a material which is liquid at 25° C. and cures above the firing temperature of the ink jet printer. The ink can be thermally cured in flight and/or on the metal or alloy. A preferred thermal cure temperature is from 50 to 175° C., more preferably from 50 to 150° C. and especially 80 to 150° C. The carrier vehicle preferably comprises one or more thermally reactive monomers, prepolymers or mixtures thereof which solidify on heating above the firing temperature. The carrier vehicle more preferably comprises at least one thermally reactive liquid monomer or more preferably a mixture of two or more thermally reactive liquid monomers.

The term monomer is used herein to include traditional monomers, macromonomers and prepolymers. The thermal cure may be achieved by the incorporation of thermally reactive cross-linking groups into one or more components of the carrier vehicle which cause cross-linking on heating. Preferred cross-linking groups are epoxy, amine, imine, activated olefinic bonds, N-alkylol, silane, aziridine, keto, aldehyde, acetoacetoxy, phenolic, melamine, formaldehyde, hydroxy, carboxy, and carbodiimide groups.

Preferably all of the thermally reactive liquid monomers in the carrier vehicle are capable of cross-linking with at least two other monomer molecules. The cross-linking may be via hydrogen bonding or ionic bonding but is preferably co-valent in nature.

A catalyst may be optionally incorporated into the etch-resist ink to accelerate the thermal cure and solidification.

However it is preferable that the catalyst be added to the etch-resist ink immediately prior to the time of use to inhibit premature reaction and poor ink jet firing.

One embodiment of thermal cure reactive inks is a one pack composition. Here the thermal cure etch-resist ink comprises all the final ink components such that it solidifies on the substrate when heated. Preferably the cross-linking groups in a one pack approach are blocked as described in U.S. Pat. No. 6,341,856. This helps prevent pre-reaction of the etch-resist ink.

When more than one type of thermally reactive liquid monomer is used the cross-linking groups on at least one monomer are preferably chosen to be co-reactive with the groups on at least one other thermally reactive liquid monomer (e.g. epoxy with amine). The preferred pairings of thermally reactive cross-linking groups are as indicated across the rows of Table 1.

TABLE 1

| Thermally reactive cross-linking group | Thermally Co-reactive cross-linking group |
|---|---|
| Epoxy | Amine, anhydride, thiol, acid, hydrazine, phenolic, N-alkyol. |
| Hydroxy/thiol | Isocyanates, epoxy, anhydride, acid, N-alkoyl, carbodiimide, aziridine. |
| Anhydride | Epoxy, amine, hydroxy, isocyanate, aziridine, carbodiimide, thiol. |
| Acid | Epoxy, amine, hydroxy, isocyanate, aziridine, carbodiimide, N-alkoyl. |
| Cyclic carbonate, aldehyde, keto, activated olefinic bond, N-alkoyl, acid, anydride, acid chloride, acetoacetoxy. | Amine |
| Activated olefinic bond | Amine, thiol, radical initiator, cationic initiator, dienes (Diels-alder reactive). |
| Amine/Hydrazine | Epoxy, isocyanate, aldehyde, diketoester, activated olefinic bond, N-alkoyl. |
| Silane, halosilane, alkoxy silane, acetosilane, silicate, silanol | Hydroxy, acid, isocyanate, silane, halosilane, alkoxy silane, acetosilane, silicate, silanol. |
| Imine | Aldehyde, epoxy, anhydride, isocyanate, ester, acetoacetoxy, activated olefinic bond. |
| Metal salts and complexes | Carboxy, keto, aldehyde, acetoacetoxy, phosphonic acid, imine, amino and thio. |
| Formaldehyde | Melamine, urea, phenol, resorcinol. |

In embodiments where the thermally reactive liquid monomer contains an activated olefinic group a preferred means of cross-linking and solidification is by the additional incorporation of a thermal radical initiator into the carrier vehicle.

Suitable thermal radical initiators include peroxides, azos and persulphates. Preferred examples of thermal initiators include persulphates especially sodium and ammonium persulphate (APS), peroxides especially benzoyl peroxide (BPO), t-butyl hydroperoxide (tBHPO) and lauryl peroxide (LPO), and azos, especially azobisisobutyronitrile (AIBN). These may be used with synergists such as organic amines. Preferred thermal radical initiators are those which are stable at 25° C. but can be activated by heating to a temperature less than 150° C.

Preferred activated olefinic groups are (meth)acrylates and especially acrylates.

With mixtures of thermally reactive liquid monomers it is advantageous to separate all the thermally reactive liquid monomers with similar cross-linking groups of one type from all of the other (e.g. separating all the amines from all the epoxys) until immediately prior to use. Such separation helps to inhibit premature reaction which could result in nozzle blockage or poor printer firing.

It is even more preferable to have the some of the curing components (catalyst and/or thermally reactive liquid monomer) of the etch-resist ink absent from the ink during firing but which are incorporated into the ink on the metal or alloy surface. For example a catalyst might be previously applied to an alloy surface on which the etch-resist ink will be printed. Alternatively, an amine containing thermally curing liquid monomer might be post added onto the surface of a metal or alloy to which an epoxy containing etch-resist ink has already been applied. It is preferred for such embodiments that both curing components are applied by ink jet printing especially wherein the ink jet printer comprises at least two cartridges and at least two printing heads such that each curing component may be stored and fired separately.

Thus a second embodiment of the thermally curable ink is a two pack system. Here part of the thermally reactive liquid monomer and/or part of the catalyst is omitted from the etch-resist ink during firing but is subsequently combined to give the full etch-resist ink composition on the metal or alloy surface. This approach is particularly useful for very reactive etch-resist inks which would cure prior to ink jet firing if used as a one pack composition.

Preferably at least one of the thermally reactive liquid monomers has a number average molecular weight of less than 10,000.

In order to increase the rate of thermal solidification it is often advantageous to have at least one thermally reactive monomer or prepolymer present in the carrier vehicle which has on average not less than 3 and especially not less than 10 cross-linking groups per molecule. Such monomers and prepolymers often have higher molecular weights and thus tend to raise the ink viscosity. Hence such monomers and polymers are preferably present at not more than 10% by weight on the total etch-resist ink. Examples of polymers which have on average not less than 10 cross-linking groups per molecule include for example polyols, polyisocyanates, polyepoxy, polyamines and polyimines, poly(meth)acrylates and poly siloxanes. Examples of monomers which have on average not less than 3 cross-linking groups per molecule include for example tri, tetra, penta and hexa functional isocyanates, alcohols, amines, epoxys, (meth)acrylates, siloxanes and imines.

Preferably the thermally curable ink is printed at a firing temperature of less than 100° C., more preferably less than 80° C., especially less than 50° C. and most especially at approximately 25° C. Thus a preferred ink for thermally curing etch-resist inks has a viscosity of less than 30 cPs at 25° C. A preferred method for ink jet firing is using a piezo ink jet printer (rather than a thermal ink jet printer). Preferably piezo firing is carried out at approximately 25° C.

Preferred Etch-Resist and Carrier Vehicle Ink Embodiments

Although the above carrier vehicle embodiments are preferred it will be readily appreciated by those skilled in the art that a multitude of approaches within the present invention exist where aspects of one carrier vehicle embodiment are combined with those of another. Thus by example it is possible to use a thermally curable etch-resist ink which comprises a volatile liquid. Similarly a holt melt etch-resist ink can comprise thermally reactive liquid monomers.

Component Containing at Least One Metal Chelating Group

The metal chelating group may be any group which can form a bond with the metal or alloy and especially with iron and ferro alloys. The surface of the metal or alloy may optionally be prepared prior to applying the etch-resist ink. This preparation can be effected by atmospheric exposure or can be the result of a chemical or physical treatment process.

Atmospheric exposure often results in the formation of oxides (e.g. iron, aluminium, zinc), hydrated oxides (e.g. $Fe_3O_4 \cdot xH_2O$) and carbonates (e.g. copper). Examples of chemical surface treatments are acid etching (e.g. HCl, $HNO_3$, $H_2SO_4$, $H_3PO_4$) and oxidizer etching (e.g. persulphates and perborates). Examples of physical treatments are heating, plasma exposure and irradiation. The metal chelating group or groups are capable of binding with the surface of the metal or alloy without any preparation although adhesion is often improved following such pretreatments.

Examples of metal chelating groups include hydroxides, especially aryl or heteroaryl hydroxides such as phenolic hydroxides; amines which may be aliphatic, aryl or heteroaryl; mercaptans which may be aliphatic, aryl or heteroaryl; carboxylic acids which may be aliphatic, aryl or heteroaryl; oximes and ketoximines; acetarylamides; hydroxy silanes and silicones; N-containing heterocycles such as imidazoles, benzimidazoles, triazoles, benzotriazoles, thiazoles, isothiazoles, acid anhydrides, and more preferably acid groups (especially carboxylic acid groups, phosphoric acid groups, polyphosphoric acid groups, phosphonic acid groups, sulphuric acid groups and sulphonic acid groups). Where more than one metal chelating group is used the metal chelating groups may be the same or different. In one preferred class of metal chelating groups which contains two chelating groups, the chelating groups are attached to adjacent carbon atoms such as β-diketones, β-keto esters, β-keto aldehydes and β-keto heterocycles.

Less preferred metal chelating groups are hydroxides, amines which may be aliphatic, aryl or heteroaryl; or mercaptans which may be aliphatic, aryl or heteroaryl.

More preferred metal chelating groups are ketoximines; acetarylamides; hydroxy silanes and alkoxy silanes; aryl or heteroaryl hydroxides (such as phenolic hydroxides); N-containing heterocycles (preferably imidazoles, benzimidazoles, triazoles, benzotriazoles, thiazoles, isothiazoles); acid anhydrides; β-diketones, β-keto esters, β-keto aldehydes, β-keto heterocycles; and acid groups (particularly carboxylic acid, phosphoric acid, polyphosphoric acid and sulphonic acid groups). Especially preferred metal chelant groups are β-diketones, β-keto esters, β-keto aldehydes and β-keto heterocycles.

An especially preferred metal chelating group is a carboxylic acid group.

One or more components of the carrier vehicle must contain at least one metal chelating group. Said component can be the wax or polyamide polymer (as in the case of hot melt etch-resist inks), the resin (as in the case of volatile etch-resist inks) or the thermally reactive monomer or prepolymer (as in the case of thermally curable etch-resist inks). These are preferred embodiments as the metal chelating groups is then chemically bound into the solidified etch-resist ink. Less preferably the component containing at least one metal chelating group can be a low molecular weight compound (having a molecular weight less than 1,000) which is not chemically bound into the final solidified etch-resist ink.

For hot melt etch-resist inks it is preferred that the carrier vehicle is a wax or polyamide polymer containing at least one metal chelating group. Especially preferred are waxes and polyamide polymers containing at least one carboxylic acid group as the metal chelating group. Preferred waxes containing at least one carboxylic acid group include oxidized waxes, polyester waxes and natural waxes.

Alternatively the metal chelating group can be present in the carrier vehicle as a long chain fatty acid. Suitable long chain fatty acids include long chain (preferably $C_{6-30}$) aliphatic carboxylates such as palmitates, stearates, laurates and the like.

For thermally curable etch-resist inks the thermally reactive liquid monomer preferably contains at least one metal chelating group. For thermally curable etch-resist inks comprising an activated olefinic group the activated olefinic monomer preferably contains a metal chelating group.

For volatile etch-resist inks the resin preferably contains at least one metal chelating group. Especially preferred resins are poly (meth)acrylics, polyurethanes and polyester comprising at least one metal chelating group. Resins containing at least one metal chelating group can be readily prepared by the polymerisation of monomers wherein at least one of the monomers contains one or more metal chelating groups.

Preferably the resin contains at least one acidic group and more preferably at least one carboxylic acid group. In the case of synthetic resins such carboxylic acid group or groups are preferably incorporated by means of a carboxylic acid containing monomer. Preferred monomers containing a carboxylic acid group for making polyolefins are acrylic acid, itaconic acid, beta carboxy ethyl acrylate, maleic acid and especially methacrylic acid. A preferred carboxylic acid monomer for making polyurethanes is dimethylol propanoic acid. Carboxy terminated polyesters are readily made by using a stoichiometric excess of the acid. Many natural resins exist which contain carboxylic acid such as carboxy celluloses and proteins containing glutamic acid.

It is preferred that the amount of metal chelating groups in the final solidified etch-resist ink is not less than $1.4 \times 10^{-5}$ moles per g, more especially not less than $3.5 \times 10^{-5}$ moles per g and especially not less than $5.6 \times 10^{-5}$ moles per g. Preferably the amount of metal chelating groups in the solidified etch-resist ink is not greater than $4.2 \times 10^{-3}$ moles per g, more preferably not greater than $2.8 \times 10^{-3}$ moles per g and especially not greater than $1.4 \times 10^{-3}$ moles per g. Preferred solidified etch-resist inks contain from $1.4 \times 10^{-5}$ to $4.2 \times 10^{-3}$ moles per g, more preferably from $3.5 \times 10^{-5}$ to $2.8 \times 10^{-3}$ moles per g and especially $5.6 \times 10^{-5}$ to $1.4 \times 10^{-3}$ moles per g of metal chelating groups.

Components Containing at Least One Acid Group

As hereinbefore described acid groups and especially carboxylic acid groups are the preferred metal chelating groups. Such groups exhibit especially good adhesion properties with iron and ferro alloys. Acid chelating groups also aid the optional removal of the etch-resist after the etching step by treatment with an alkaline aqueous medium.

The acid group or groups in the component in the carrier vehicle may be in the salt form but are preferably in the free acid form. Preferred salts forms include mono valent metal salts (e.g. sodium, potassium and lithium salts) as well as ammonium, substituted ammonium, quaternary ammonium, pyridinium and benzalkonium salts. Such salts are not strongly chelating with the acid functional group and we have found the process of the present invention results in the etch-resist inks having improved adhesion to metal and alloy surfaces when such salts are used.

It is preferred that at least one component in the carrier contains at least one acid metal chelating group such that the etch-resist ink has an acid value of greater than 30, more preferably greater than 40 mg KOH/g. Although inks having an acid value above 150 mg KOH/g may be used, there is generally no advantage in such levels. In fact high acid levels can result in premature removal of the etch-resist ink during the etching step. Thus it is preferred that at least one of the components in the carrier vehicle contains at least one acid metal chelating group and the etch-resist ink has an acid value from 40 to 150 mg KOH/g.

In some embodiments where adhesion and alkali removability need to be independently controlled it is preferable that the carrier vehicle comprises two or more types of metal chelating groups wherein at least one of the metal chelating groups is an acid group and at least one of the metal chelating groups is not an acid group. The metal chelating groups may be present in different carrier components but it is preferable that such groups are incorporated into the same carrier component.

The Colorant

The colorant, when present, is preferably a pigment and may be organic or inorganic including those pigments with surface modification which facilitates self dispersion in the etch-resist ink. The pigment may be from any of the recognised classes of pigments described, for example, in the Third Edition of the Colour Index (1971) and subsequent revisions of and supplements thereto under the chapter headed "Pigments". Examples of inorganic pigments are titanium dioxide, Prussian blue, cadmium sulphide, iron oxides, vermillion, ultramarine and the chrome pigments, including chromates, molybates and mixed chromates and sulphates of lead, zinc, barium, calcium and mixtures and modifications thereof which are commercially available as greenish-yellow to red pigments under the names primrose, lemon, middle, orange, scarlet and red chromes. Examples of organic pigments are those from the azo, diazo, condensed azo, thioindigo, indanthrone, isoindanthrone, anthanthrone, anthraquinone, isodibenzathrone, triphenodioxazine, quinacridone and phthalocyanine series, especially copper phthalocyanine and its nuclear halogenated derivatives, and also lakes of acid, basic and mordent dyes. Carbon black, although strictly inorganic, behaves more like an organic pigment in its dispersing properties. Preferred organic pigments are phthalocyanines, especially copper phthalocyanines, monoazos, diazos, indanthrones, anthanthrones, quinacridones and carbon blacks.

A preferred colour of colourant for the etch-resist ink is blue.

The pigment is typically incorporated into the etch-resist ink jet ink composition by milling it together with one or more components of the carrier vehicle and in the presence of a dispersant. The dispersant is preferably a polyester/polyamine and is, for example, a dispersant as disclosed in U.S. Pat. No. 6,197,877. Dispersants of this type are available under the trademark Solsperse™ (from Lubrizol). The dispersant may also include a dispersant synergist (also known as a fluidizer) such as a quaternary ammonium salt of a partially sulphonated copper phthalocyanine pigment. Examples of such dispersant synergists are disclosed in GB-A-1508576, GB-A-2108143 and WO 01/14479 and are available under the Solsperse™ trademark.

The ratio of dispersant to dispersant synergist is typically from 1:1 to 10:1 by weight and is preferably about 5:1 by weight. The total amount of dispersant and dispersant synergist to pigment may vary over wide limits and is typically from 50% to 150% by weight relative to the weight of colorant. The amount of colorant in the etch-resist ink is preferably not greater than 4 parts, more preferably not greater than 3 parts and especially not greater than 2 parts by weight.

Preferably the amount of colorant in the etch-resistant ink is from 0.01 to 4 parts, more preferably from 0.1 to 3 parts and especially from 0.1 to 2 parts by weight.

Surfactant

The surfactant, when present, may be any surface-active material which aids the homogeneity of the ink and/or provides desirable surface tension and wetting properties to the resultant ink. The surfactant may also be selected to adjust the firing characteristics of the ink composition within the desired limits. The surfactant is preferably anionic and especially non-ionic and is preferably aliphatic in nature, optionally containing silicon and/or fluorine atoms.

Surfactants in inks often bloom to the surface of the solidified ink and cause a mottled or matte appearance. This surfactant bloom may also result in reduced resistance of the etch-resist ink to the conditions of metal or alloy etching. Thus it is preferred that the surfactant contains at least one reactive group that can be chemically bonded within the solidified etch-resist ink. This bonding may be hydrogen bonding but is preferably a salt bond and especially a covalent bond. The bonding can be to some of the metal chelating groups or alternatively the components in the carrier vehicle can comprise chemical groups which are co-reactive towards the surfactant.

Such reactive surfactants chemically bond especially strongly with carrier vehicles comprising one or more thermally reactive monomers, prepolymers or mixtures thereof (the thermally curable etch-resist embodiment).

Preferably the surfactant has one reactive cross-linking group (as indicated in Table 1, column 1) and the monomer and/or prepolymer present in the thermally curable etch-resist ink embodiment has a co-reactive cross-linking group (Table 1, column 2).

The etch-resist ink preferably has a surface tension of from 20 to 40 and especially from 25 to 35 mN/m at a temperature of 25° C. Preferably the surface tension is measured by a Du Nouy ring method.

The amount of surfactant in the etch-resist ink is preferably from 0.0 to 1.00 parts and especially from 0.01 to 0.7 parts by weight.

Other Etch-Resist Ink Adjuvants

The etch-resist ink may contain other adjuvants which are suitable for use in ink jet printing ink compositions in addition to components A) to C) specified above. Such adjuvants include slip modifiers, thixotropic agents, anti-foaming agents, plasticizers, antioxidants, stabilisers, gloss agents, fungicides, bactericides, organic and/or inorganic filler particles, levelling agents, opacifiers and antistatic agents.

Preferences for Etch-Resist Inks

Preferred etch-resist inks are filtered through a filter having a pore size of 10 microns, more preferably 5 microns and especially 1 micron to remove particles which might block an ink jet nozzle.

Preferably the viscosity of the etch-resist ink is from 8 to 15 cPs (mPa·s) at the firing temperature.

Metal or Alloy

The metal or alloy can be any of those suitable for Photochemical Machining (PCM) and includes metals and their alloys from group IA, group IIA, group IIIB, group IVB, group VB, group VIB, the transition metals, the lanthanides and actinides of the Periodic Table according to Mendeleof, as published for example on the front inside cover of *BASIC INORGANIC CHEMISTRY*, COTTON/WILKINSON/GAUS, second Ed, ISBN 0-471-85151-5.

Suitable metals and alloys include aluminium, bronze, beryllium, chromium, columbium, constantan, copper and copper alloys, gold, nickel and nickel alloys, lead, magnesium, molybdenum, niobium, platinum, silver, stainless steel, mild steel, tin, titanium, tungsten, vanadium, zinc and zirconium. Preferred metals and alloys are stainless steel, mild steel, beryllium, beryllium copper, copper; Iconel, Kovar, Monel and other nickel alloys especially Ferro nickel alloys such as Invar and alloy 42; nickel, aluminium, brass, molybdenum and titanium. Iron and ferro alloys are especially preferred.

Prior to applying the etch-resist ink to the metal or alloy, the metal surface is preferably cleaned. Suitable cleaning methods known in the art include rinsing in organic solvent, rinsing with aqueous detergent solution, mechanical abrasion such as sand-blasting, micro-etching with aqueous acids (e.g. HCl and $H_2SO_4$) and aqueous oxidative cleaning with, for example, persulphate or perborate.

Printing Process

The etch-resist ink may be applied to the metal or alloy surface using any suitable ink jet printing processes. In these processes ink is fired from an ink jet printer, preferably at a firing temperature of from 10 C. to 150 C. Printing can be performed, for example, by a thermal ink jet printer or an electrostatic ink jet printer but preferably the printer is a piezo ink jet printer. Printing may be carried out either continuously or by a drop of demand (DOD) process. The thickness of the ink jet printed etch-resist can be varied widely according to the specific requirements of the metal or alloy and etchant used. Preferably the etch-resist ink is applied as a layer of from 1 to 50 microns thick. In some cases it is advantageous to vary the thickness of the etch-resist over the metal or alloy surface. This can facilitate greater versatility and control in the etch step. In the case of hot melt inks the etch-resist ink is heated prior to and during firing to melt and liquefy the ink.

Solidification Step

The solidification step may be performed by any means known in the art other than by exposure of the etch-resist ink to actinic light and/or particle beam radiation sources. That is to say solidification cannot be by exposure to actinic light, particle beam radiation or a combination of actinic light and particle beam radiation. Preferably solidification is achieved by heating, by evaporation of at least one volatile liquid component of the carrier vehicle or more preferably by cooling. Other less preferred methods of solidification include exposure to air (e.g. using so called alkyd curing resins), exposure to moisture (e.g. applicable to cyano acrylates for example) and electrolytic coagulation. For holt melt etch-resist inks (also known as phase change inks) the method of solidification is cooling. The hot melt etch-resist ink is fired in its molten state and on cooling to an ambient temperature (typically 25° C. to 15° C.) the etch-resist ink solidifies (freezes). The metal or alloy surface can be cooled below 25° C. if faster solidification is needed. In the case of thermally curable etch-resist inks the solidification is achieved by heating. Heating can be performed by any means known in the art but the use of hot air and the application of heat underneath the metal or alloy (i.e. to a non-printed surface) are particularly suitable. In the case of the etch-resist inks having a volatile component in the carrier vehicle the method of solidification is by evaporation of a volatile liquid in the etch-resist ink. The volatile liquid may evaporate readily at 25° C. or heating may be used to facilitate or speed evaporation. Evaporation of the volatile liquid may also be accelerated by a reduction in pressure though this is less preferable to heating.

Etching Step

After solidification of the etch-resist ink the metal or alloy is subjected to a chemical etching process to remove those parts of the metal or alloy which are not protected by the solidified etch-resist ink. The removal of this metal or alloy results in the desired etch pattern. The etching may be restricted to the surface or may fully penetrate the metal or alloy.

The chemical etching may be carried out by any means appropriate to the metal or alloy concerned. Table 2 summarises the preferred etchants for preferred metals and alloys.

TABLE 2

| Metal | Common etchants* | Temperature ° C. |
|---|---|---|
| Stainless steel (many grades) | 35-42° Bé $FeCl_3$ | 35-55 |
| Mild steel | 35-42° Bé $FeCl_3$ | 35-55 |
| Beryllium copper | 30-42° Bé $FeCl_3$ or ammoniacal copper or 33° Bé acidic $CuCl_2$ | 40-55 |
| Copper and copper alloys | 30-42° Bé $FeCl_3$ or ammoniacal copper or 33° Bé acidic $CuCl_2$ | 40-55 |
| Inconel and other high nickel alloys | 38-42° Bé $FeCl_3$ or conc nitric/conc hydrochloric acid/water 1:1:3 | 45-55 |
| Aluminium | 20% NaOH or conc hydrochloric acid/water 1:4 or alkaline potassium ferricyanide | 60-90 20-65 55 |
| Brass | 30-42° Bé $FeCl_3$ or ammoniacal copper or 33° Bé acidic $CuCl_2$ | 40-55 |
| Molybdenum | Alkaline potassium ferricyanide or 40° Bé $Fe(NO_3)_3$ | 55 40-55 |
| Titanium | 10-50% HF (optionally with $HNO_3$) | 30-50 |

*The concentration of etchant (column 2) is measured in Degrees Baume (° Bé) where:
° Bé = 145 (SG – 1/SG); and
SG is the specific gravity (density) of the solution.

Etching is typically carried out at a temperature from 20 to 100° C. (preferably between 25 and 60° C.) and includes spraying or dipping where the metal or alloy may be contacted with the chemical etchant in either the horizontal or vertical position. Spraying is preferred, especially where the metal or alloy is in the vertical position since this allows for quicker removal of the chemical etchant containing removed metal and/or alloy. The speed of etching may be accelerated by agitating the chemical etchant, for example using sonic agitation.

Post Etch Treatment

After the metal or alloy has been etched the chemical etchant is preferably rinsed with an organic solvent or more preferably with water to remove traces of the chemical etchant.

Optional Removal of the Etch-Resist Ink

The solidified etch-resist ink may be left in place on the surface of the metal or alloy. According to a second aspect of the present invention there is provided a metal or alloy partially coated with a solidified etch-resist ink obtained by the process according to the first aspect of the present invention.

The solidified etch-resist ink may be removed after etching. Preferably removal is achieved by chemical treatment and more preferably removal is by treatment with an alkaline medium. Alkaline removal is especially effective with etch-resist inks which contain one or more acid metal chelating groups. The alkaline medium can be solvent-based but is preferably aqueous. Solvent-based alkaline media preferably contain organic amines, especially alkanolamines such as ethanolamine in an organic solvent. Preferred organic solvents are polar in nature as these tend to wet metals and alloys better and since the polar solvent itself may readily be washed from the metal with water. However, it is much preferred to use an aqueous alkaline medium, typically containing an alkali such as ammonia or a metal hydroxide, carbonate and/or bicarbonate.

Typically alkaline treatment is performed at a temperature from 0 to 100° C., preferably 40 to 60° C. to remove the etch-resist ink.

Alternative (less preferred) methods for removing the solidified etch-resist ink include solvent stripping, heating, abrasion, ultrasound, burning/oxidizing, cutting and plasma treating. Solvent stripping can be performed in non-polar aprotic solvents (e.g. aromatic solvents and halogenated solvents) or in polar aprotic solvents (e.g. Dimethyl sulphoxide, dimethyl formamide, N-methylpyrrolidone etc).

Thus according to a third aspect of the present invention there is provided a metal or alloy obtained by the process according to the first aspect of the present invention wherein the solidified etch-resist ink has been removed after etching.

Non-Etchable Support

In embodiments where a non-etchable support has been used, said support is preferably removed at some point after etching. The non-etchable support is preferably a non-metallic material, more preferably a ceramic, glass, wood, textile, wax, paper, plastics material or rubber material.

Preferred Articles

According to a fourth aspect of the present invention there is provided an article made by the process according to the first aspect of the present invention having a chemically etched surface pattern or design. Examples of specific articles are a grid, a filter, a graticule, a mesh, a light chopper disc, a heat sink plate, a heater element, a screen, colour TV mask, a diaphragm, a shim, a gasket, a washer, a spring, a cog, a link, a probe, a magnetic recording head, a circuit lead frame, an encoder disc, an item of jewelry, a rule, a scale, a clutch plate, an emitter contact, a micro reactor, a suspension lead, an ink jet nozzle plate, a stencil, a razor foil, a bearing, an edge filter, a logo, a nameplate, a decorative plaque, an instrument case, a box, an enclosure and a potentiometer case made by the process of the present invention. Especially preferred articles are those wherein the etchant fully penetrated the metal or alloy in the article The present invention is further illustrated by the following non-limiting examples. Unless otherwise stated all parts are by weight.

EXAMPLES

Example 1

Etch-Resist Ink (1)

Preparation of a Thermally Curable Etch-Resist Ink which Comprises Water

Preparation of Polymer A

Polymer A is a acrylic copolymer containing 70% by weight of methacrylic acid and 30% by weight of methyl methacrylate prepared by a catalytic chain transfer method to give a polymer having a number averaged molecular weight of approximately 600 as measured by GPC.

An Etch-resist ink (1) was prepared by mixing water (72 parts), aqueous ammonia solution having a specific gravity of 0.88 (12 parts), Polymer A (12 parts) and Primid™ XL552 (4 parts). Primid™ XL552 is a hydroxyl alkyl amide cross-linker supplied by EMS Chemie. Etch-resist ink (1) was printed using a HP deskjet 5500 ink jet printer in the form of a rectangle onto half of the surface of copper coated poly ethylene naphthenate (PEN) film measuring approximately 21 cm by 30 cm.

The Etch-resist ink (1) on the printed film was thermally cured by heating the film to a temperature of 150° C. for 1 hour. Copper was etched from the unprinted areas of the PEN film using an etchant bath containing a ferric chloride etchant solution of strength 42° Baume supplied by RS. The etching was performed for 10 mins at a temperature of 50° C. The thermally cured Etch-resist ink (1) was then removed from the etched PEN film using an aqueous solution of 2.5% by weight caustic at a temperature of 50° C. for 10 mins.

The resultant etched film was rinsed with water and dried in air at 25° C.

The resultant etched film showed a completely unetched area of copper where the original Etch-resist ink (1) print had previously been. Areas where no etch-resist ink was ever present showed full etching of the copper with none remaining in such areas.

Example 2

Etch-Resist Ink (2)

Preparation of a Thermally Curable Etch-Resist Ink which is Free from Water

An Etch-resist ink (2) was prepared by mixing 1-methyl-2-pyrrolidinone (84 parts), Primid™ XL 552 (4 parts) and Polymer A (12 parts), obtained as described in Example 1.

Etch-resist ink (2) was printed in the form of a rectangle onto half of the surface of copper coated FR4 board using a Xaar XJ500 ink jet print head.

The print was thermally cured by heating the board to a temperature of 180° C. for 1 hour.

Copper was etched from the unprinted areas of the FR4 board using an etchant bath containing a ferric chloride etchant solution of strength 42° Baume supplied by RS. The etching was performed for 10 mins at a temperature of 50° C.

The thermally cured Etch-resist ink (2) was then removed from the unetched areas of copper by immersing the film in an aqueous solution of 5% by weight caustic at a temperature of 50° C. The resultant etched FR4 board was rinsed with water and dried by air at 25° C.

The resultant etched board showed a complete area of copper in the areas where the Etch-resist ink (2) had previously been. Areas where no etch-resist ink was ever present showed full etching of the copper with none remaining in such areas.

Example 3

Etch-Resist Ink (3)

A Hot Melt Etch-Resist Ink

The black hot melt ink was removed from a Tectonics 3800 printer cartridge, to give Etch-resist ink (3).

Etch-resist ink (3) was coated in the form of a rectangle onto half of the surface of a copper coated FR4 board. The resultant coating had a thickness of from 50 to 100 microns. The coating was allowed to cool and solidify.

Copper was etched from the uncoated areas of the FR4 board using an etchant bath containing a ferric chloride etchant solution of strength 42° Baume supplied by RS. The etching was performed for 10 mins at a temperature of 50° C.

After etching the Etch-resist ink (3) had suffered no damage and remained well, adhered to the FR4 copper surface. No undercutting could be seen. Areas where no etch-resist ink was ever present showed full etching of the copper with none remaining in such areas.

The invention claimed is:

1. A process for etching a metal or alloy surface which comprises applying a hot melt etch-resist ink by ink jet printing to selected areas of the metal or alloy, solidifying the etch-resist ink by cooling and then removing the exposed metal or alloy by a chemical etching process wherein the hot melt etch-resist ink comprises the components:
   A) 60 to 100 parts carrier vehicle comprising one or more components which contain at least one metal chelating group;
   B) 0 to 40 parts colorant; and
   C) 0 to 5 parts surfactant;
wherein the ink has a viscosity of not greater than 30 cPs (mPa·s) at the firing temperature, all parts are by weight and the total number of parts A)+B)+C)=100.

2. A process as claimed in claim 1 wherein the metal chelating group(s) are selected from the group consisting of ketoximines; acetarylamides; hydroxy silanes and alkoxy silanes; aryl or heteroaryl hydroxides; N-containing heterocycles; acid anhydrides; β-diketones, β-keto esters, β-keto aldehydes, β-keto heterocycles; and acid groups.

3. A process as claimed in claim 1 wherein the metal chelating group(s) are selected from the group consisting of imidazoles, benzimidazoles, triazoles, benztriazoles, thiazoles and isothiazoles.

4. A process as claimed in claim 1 wherein the metal chelating group(s) are selected from the group consisting of β-diketones, β-keto esters, β-keto aldehydes and β-keto heterocycles.

5. A process as claimed in claim 1 wherein the metal chelating group(s) are acid groups.

6. A process as claimed in claim 5 wherein the acid groups are selected from the group consisting of carboxylic acid, phosphoric acid, polyphosphoric acid, phosphonic acid, sulphuric acid and sulphonic acid groups.

7. A process as claimed in claim 5 wherein the acid groups are carboxylic acid groups.

8. A process as claimed in claim 1 wherein the carrier vehicle comprises two or more types of metal chelating groups wherein at least one of the metal chelating groups is an acid group and at least one of the metal chelating groups is not an acid group.

9. A process as claimed in claim 1 wherein the colorant is a pigment.

10. A process as claimed in claim 1 wherein the colorant is blue.

11. A process as claimed in claim 1 wherein the etch-resist ink has been filtered through a filter having a pore size of 1 micron.

12. A process as claimed in claim 1 wherein the viscosity of the etch-resist ink is from 8 to 15 cPs (mPa·s) at the firing temperature.

13. A process as claimed in claim 1 wherein the firing temperature is from 50 to 150° C.

14. A process as claimed in claim 1 wherein at least one component of the carrier vehicle contains at least one acid metal chelating group and the etch-resist ink has an acid value from 40 to 150 mg KOH/g.

15. A process as claimed in claim 1 wherein the metal or alloy is iron or a ferro alloy.

16. A process as claimed in claim 1 wherein the carrier vehicle comprises a wax or polyamide polymer or a mixture thereof.

17. A process as claimed in claim 1 wherein the etching fully penetrates the metal or alloy.

18. A process as claimed in claim 1 wherein the solidified etch-resist is removed after etching.

19. A process as claimed in claim 18 wherein the solidified etch-resist is removed by treatment with an alkaline medium.

20. An etched metal or alloy partially coated with a solidified etch-resist made by the process as claimed in claim 1.

* * * * *